(12) United States Patent
Manning

(10) Patent No.: US 8,373,561 B2
(45) Date of Patent: Feb. 12, 2013

(54) INFRARED DETECTOR

(75) Inventor: Paul A Manning, Malvern (GB)

(73) Assignee: Qinetiq Limited, London (GB)

( * ) Notice: Subject to any disclaimer, the term of this patent is extended or adjusted under 35 U.S.C. 154(b) by 800 days.

(21) Appl. No.: 11/665,452

(22) PCT Filed: Nov. 11, 2005

(86) PCT No.: PCT/GB2005/004354
§ 371 (c)(1),
(2), (4) Date: Apr. 16, 2007

(87) PCT Pub. No.: WO2006/051308
PCT Pub. Date: May 18, 2006

(65) Prior Publication Data
US 2007/0290868 A1     Dec. 20, 2007

(30) Foreign Application Priority Data

Nov. 12, 2004    (GB) .................................. 0424934.8

(51) Int. Cl.
*G08B 13/18*    (2006.01)
*G08B 17/12*    (2006.01)
*G08B 17/10*    (2006.01)
*H01L 25/00*    (2006.01)
*G01J 5/00*     (2006.01)
*G01J 5/02*     (2006.01)

(52) U.S. Cl. ........ 340/567; 340/578; 340/584; 340/600; 340/630; 250/332; 250/338.1; 250/338.3; 250/339.02

(58) Field of Classification Search .................. 340/567, 340/578, 584, 600, 630; 250/332, 338.1, 250/338.3, 339.01, 339.1
See application file for complete search history.

(56) References Cited

U.S. PATENT DOCUMENTS 2,587,674 A    3/1952    Aiken
3,604,930 A *  9/1971    Allen ............................ 250/331
(Continued)

FOREIGN PATENT DOCUMENTS

EP    1 267 399    12/2002
FR    2 826 725    1/2003
(Continued)

OTHER PUBLICATIONS

International Search Report for PCT/GB2005/004354 mailed Feb. 8, 2006.

(Continued)

*Primary Examiner* — George Bugg
*Assistant Examiner* — Anne V Lai
(74) *Attorney, Agent, or Firm* — Nixon & Vanderhye P.C.

(57) ABSTRACT

An infrared detector comprising a plurality of bolometer detectors, bias circuitry for applying a bias to the bolometer detectors, and connectors for connecting the bolometer detectors together to form a network, wherein the bolometer detectors are arranged in an environment at substantially atmospheric pressure. A method for increasing the sensitivity of an infrared detector, having a plurality of bolometer detectors arranged in an environment at substantially atmospheric pressure so as to at least partly compensate for a reduction in the sensitivity of the infrared detector due to conduction of thermal energy from the bolometer detectors through the environment, the method comprising at least one of the steps of connecting the bolometer detectors together in at least one of series and parallel, and operating the bolometer detectors at a DC bias current.

21 Claims, 3 Drawing Sheets

U.S. PATENT DOCUMENTS

| | | | |
|---|---|---|---|
| 3,767,928 A | 10/1973 | Bishop et al. | |
| 3,781,748 A | 12/1973 | Bishop et al. | |
| 4,195,234 A * | 3/1980 | Berman | 307/117 |
| 5,465,080 A * | 11/1995 | Liddiard et al. | 340/567 |
| 5,895,233 A | 4/1999 | Higashi et al. | |
| 6,163,061 A | 12/2000 | Iida | |
| 6,188,069 B1 * | 2/2001 | Endoh | 250/338.1 |
| 6,222,454 B1 * | 4/2001 | Harling et al. | 340/584 |
| 6,359,460 B1 * | 3/2002 | Tanaka | 324/765 |
| 6,441,372 B1 | 8/2002 | Kawahara | |
| 6,498,564 B2 * | 12/2002 | Oda | 340/567 |
| 6,652,452 B1 * | 11/2003 | Seifert et al. | 600/140 |
| 6,683,310 B2 * | 1/2004 | Wood | 250/338.1 |
| 6,717,147 B2 * | 4/2004 | Oda | 250/338.1 |
| 6,730,909 B2 * | 5/2004 | Butler | 250/338.1 |
| 7,030,378 B2 * | 4/2006 | Allen et al. | 250/332 |
| 7,106,374 B1 * | 9/2006 | Bandera et al. | 348/308 |
| 7,253,411 B2 * | 8/2007 | Kaushal et al. | 250/338.1 |
| 7,858,941 B2 * | 12/2010 | Kaushal et al. | 250/348 |
| 2002/0000649 A1 | 1/2002 | Tilmans et al. | |
| 2002/0125430 A1 * | 9/2002 | Wood | 250/338.1 |
| 2002/0179842 A1 | 12/2002 | Ookawa | |
| 2003/0071215 A1 | 4/2003 | Ajisawa | |
| 2003/0168599 A1 | 9/2003 | Liddiard | |
| 2003/0209668 A1 | 11/2003 | Tohyama | |
| 2004/0211901 A1 * | 10/2004 | Syllaios et al. | 250/339.02 |
| 2004/0219706 A1 | 11/2004 | Wan | |
| 2006/0244067 A1 * | 11/2006 | Socher et al. | 257/350 |

FOREIGN PATENT DOCUMENTS

| | | |
|---|---|---|
| GB | 2 392 555 | 3/2004 |
| JP | 63-280452 | 11/1988 |
| JP | 08-181916 | 7/1996 |
| JP | 10-038677 | 2/1998 |
| JP | 10-307061 | 11/1998 |
| JP | 2001-324390 | 11/2001 |
| JP | 2004-279103 | 10/2004 |
| WO | 01/14838 | 3/2001 |
| WO | WO 02/33366 | 4/2002 |

OTHER PUBLICATIONS

UK Search Report for GB 0424934.8, date of search: Feb. 25, 2005.
Iborra et al., "IR Uncooled Bolometers Based on Amorphous $Ge_x$-$Si_{1-x}O_y$ on Silicon Micromachined Structures," Journal of Microelectromechanical Systems, vol. 11, No. 4, Aug. 2002, pp. 322-329, XP-11064777.
M.L. Sheu et al, "A Cross-Check Test Scheme for Infrared Focal Plane Array" ASIC, 2002 Proceedings, Aug. 2002, pp. 109-112.
EPO Summons to attend oral hearing proceedings for EP 05802439.9.
Decision to refuse a European Patent application dated Dec. 23, 2010 in EP 05 802 439.9.
Chinese 3$^{rd}$ Office Action dated Apr. 20, 2011 in CN 200580038796.9.
D. Jakonis et al, "Readout architectures for uncooled IR detector arrays" Elsevier Sensors and Actuators vol. 84, 2000, pp. 220-229.
English translation of Chinese 1$^{st}$ Office Action dated Mar. 6, 2009 in CN 200580038796.9.
English translation of Chinese 2$^{nd}$ Office Action dated Jun. 17, 2010 in CN 200580038796.9.
English translation of Chinese 4$^{th}$ Office Action dated Oct. 20, 2011 in CN 200580038796.9.
W. Wang et al, "Mine Passive Infrared Alarm System" Coal Mine Automation, No. 4, pp. 7-8, 1992 and English translation.
English translation of Notice of Rejection (Official Action) mailed Nov. 15, 2011 in JP 2007-540712.
English translation of Chinese Decision on Rejection dated Mar. 31, 2012 in CN 200580038796.9.

\* cited by examiner

INFRARED DETECTOR

This application is the U.S. national phase of international application PCT/GB2005/004354 filed 11 Nov. 2005, which designated the U.S. and claims benefit of GB 0424934.8 filed 12 Nov. 2004, the entire contents of each of which are hereby incorporated by reference.

BACKGROUND OF THE INVENTION

1. Field of the Invention

The present invention relates to an infrared detector, and in particular to a passive infrared (PIR) detector. Such infrared detectors find application in intruder detection systems and fire alarms.

2. Discussion of Prior Art

By way of background to the present invention, conventional passive infrared (PIR) detectors typically utilise pyro-electric detector elements comprising a lead-based ceramic material, for example lead zirconate titanate (PZT). The lead-based ceramic material used within the detector elements is relatively easy to process and the associated manufacturing technology is mature. Many tens of millions of PIR detectors are made every year at a typical cost of around 1 US dollar per detector element.

Despite the foregoing, conventional lead-based PIR detectors do suffer several potential disadvantages.

Conventional PIR sensors typically comprise a sub-assembly having several discrete components including a PIR detector element. The PIR detector element is cut from pressed ceramic material and undergoes several processing steps whereby the thickness is reduced and detector is polished. The detector element is subsequently mounted in a package and interfaced to a read-out transistor. An infrared (IR) transparent window or lens is usually fitted to the PIR sensor. Processing and assembly of the various components into the PIR sub-assembly is protracted and requires the separate manufacture of the detector in bulk, fabrication of the detector itself, and assembly of the detector with an amplifier chip. Hence, the discrete manufacturing steps associated with processing, packaging and interfacing the PIR detector element conspire to increase the overall cost of the PIR sub-assembly.

With regard to technical performance, operating parameters for conventional PIR detectors are largely governed by the properties of the PZT material from which the detector element is made, and the degree to which it is thermally isolated from its substrate. Variability within the composition of the material PZT can affect detector performance, resulting in poorly defined and variable operating parameters, e.g. time constant etc.

The performance of the PIR detector is also a function of the design of the detector element, which is fixed at the time of manufacture. Accordingly, key operating parameters (e.g. field of view) for conventional PIR detectors cannot be altered after manufacture, nor tailored easily to meet end-users' specific requirements.

Another factor which may affect the continued use of conventional lead-based PIR detectors is the present desire to eliminate heavy metals from electrical and electronic equipment. Indeed, European Community Directive 2002/95/EC on the restriction of the use of certain hazardous substances (RoHS) in electrical and electronic equipment will be enforced throughout the European Community (EU) from 1 Jul. 2006. Manufacturers of conventional lead-based PIR detectors will thus have to find an alternative form of detector, which does not contain lead, to supply existing PIR detector markets.

Several alternatives to conventional lead-based PIR detectors exist, although such alternatives are aimed at different applications to conventional PIR detectors. For example, Lithium Tantalate may be used as an alternative material within a PIR detector. However, Lithium Tantalate is traditionally used for applications requiring high performance and accordingly the high cost of the material leads to its use in high-quality longer range detection systems, which also have a higher cost.

Bolometer detectors provide a further alternative class of infrared detectors. Bolometer detectors are traditionally aimed at medium to high performance civil and military infrared imaging applications and are usually configured in a two-dimensional focal plane array (FPA). Such a bolometer array is traditionally operated in a vacuum within an hermetically sealed enclosure. The technology to provide long-term sealing of the hermetic enclosure is expensive. Further, the array may need to be temperature stabilised, and the absolute temperature controlled carefully, to ensure adequate performance. Complex signal processing electronics are usually required to decode the multiplexed output from this type of detector and to correct for non-uniformity in the outputs from the detector elements within the array.

Mindful of the foregoing, bolometer detectors are not considered as a credible alternative to conventional PZT PIR detectors on grounds of disparate technical performance and cost.

It is an object of the invention to provide an alternative infrared detector. It is a further object of the invention to provide an infrared detector which mitigates at least some of the disadvantages of conventional PIR detectors described above.

SUMMARY OF THE INVENTION

According to a first aspect of the present invention there is now proposed an infrared detector comprising a plurality of bolometer detectors, means for applying a bias to the bolometer detectors, and means for connecting the bolometer detectors together to form a network, wherein, the bolometer detectors are arranged in an environment at substantially atmospheric pressure and, in use, the bias means is arranged to operate the bolometer detectors at a substantially constant bias temperature.

The above infrared detector is advantageous in that it eliminates the vacuum environment within which bolometer detectors are traditionally operated, whilst maintaining adequate sensitivity and performance. The technology required to fabricate and maintain a vacuum environment for conventional bolometer detectors is relatively expensive. Hence, the present infrared detector offers significant cost savings over conventional bolometer detectors.

In the interests of clarity, standard atmospheric pressure is conventionally defined as a unit of pressure equal to 760 mm mercury or 14.7 pounds per square inch ($1.01325 \times 10^5$ Pascals). However, these figures refer to standard atmospheric pressure at sea level, at 0° Celsius and under standard gravity. Reference herein to atmospheric pressure shall be taken to refer to an ambient pressure and shall not be limited by the above absolute figures. The skilled person will readily appreciate that atmospheric pressure is not a constant, but varies as a function of several parameters including location (e.g. altitude, temperature, gravity), and meteorological conditions, etc.

In a preferred embodiment, the connecting means is arranged, in use, to connect the bolometer detectors together in at least one of series and parallel within the network. Connecting the bolometer detectors together in this manner enables the overall sensitivity of the infrared detector to be increased. The improvement in sensitivity is equal to the square root of the number of detectors so connected together within the network. The improvement in sensitivity at least partly compensates for the degradation in performance of the bolometer detectors due to conduction of thermal energy therefrom.

In another preferred embodiment, the bias means is arranged, in use, to provide a DC bias current to the bolometer detector elements within the network.

The non-evacuated environment within which the present bolometer detectors are operated confers an additional, hitherto unrealised benefit, namely the higher thermal conductance attendant with the non-evacuated environment enables a larger bias current (DC bias) to be used for a given temperature rise within the bolometer detectors. Since the signal current from the bolometer is proportional (to a first order approximation) to the bias current, increasing the bias current in the present manner increases the overall sensitivity of the infrared detector. As before, this improvement in sensitivity at least partly compensates for the degradation in performance of the bolometer detectors due to increased thermal conduction through the environment. In contrast to the above, AC bias is traditionally used for evacuated bolometer detectors to preclude overheating and thermal cycling of the detectors which can lead to fatigue and failure of the detector elements.

Accordingly, the present infrared detector confers an unexpected advantage by exploiting the increased thermal conductivity of the non-evacuated environment to at least partially compensate for the degradation in performance caused by the same.

Preferably, the infrared detector comprises a substrate having the bolometer detectors, the bias means, and the connecting means integrated thereon. Read-out and signal processing circuitry may also be integrated on the same substrate. An integrated infrared detector facilitates fabrication and therefore reduces manufacturing costs over discrete components.

Accordingly, the infrared detector may comprise a monolithic integrated circuit and in particular a silicon monolithic integrated circuit. The monolithic integrated circuit may be one of an n-channel MOSFET (NMOS) integrated circuit, a p-channel MOSFET (PMOS) integrated circuit and a complementary MOSFET (CMOS) integrated circuit. Hence, the infrared detector may be fabricated using technologies found on a standard Silicon IC manufacturing line.

Conveniently, the bias temperature, in use, is in the range 1° C. to 50° C. above ambient inclusive. Preferably, the bias temperature, in use, is in the range 1° C. to 20° C. above ambient inclusive. Even more preferably, the bias temperature, in use, is in the range 1° C. to 10° C. above ambient inclusive.

In one embodiment, the connecting means comprises a plurality of hard-wired connections formed between the bolometer detectors within the network.

In another embodiment, the connecting means is capable of reconfiguring the bolometer detectors within the network into a plurality of configurations. Advantageously, the connecting means is capable of reconfiguring the bolometer detectors within the network in real time. The ability to reconfigure the bolometer detectors enables the field of view of the infrared detector to be tailored to end users' individual requirements. Blocks of bolometers may be switched into or out of the infrared detector to dynamically alter the apparent shape of the composite PIR detector element formed there from.

For example, the field of view may be arranged to correspond with an entrance, an exit or a window. Furthermore, troublesome infrared sources (for example space heaters, radiators etc.) can be excluded from the field of view, thereby reducing false alarms. Re-configurability in real-time can be used to confer a degree of intelligence to the infrared detector, enabling the infrared detector to adapt its response to changes or patterns in the incident infrared radiation.

Preferably, the bolometer detectors comprise at least one resistance bolometer. Specifically, the bolometer detectors may comprise at least one micro-bridge bolometer.

Conveniently, the bolometer detectors are arranged in rows and columns.

Advantageously, the number of bolometers is in the range 10-1000 inclusive. Typically, to replace a PIR detector with an area between 0.5 mm$^2$ and 1 mm$^2$ would require 40 to 200 bolometer detectors, typically 75 μm square, to be used.

Preferably, the bolometer detectors are adapted to detect radiation having a wavelength in the range 3 μm-14 μm. Sub-bands may be chosen for particular applications, e.g. 8 μm-14 μm for the rejection of false alarms due to sunlight or a narrow band around 4.2 μm for the detection of flames.

The environment within which the bolometer detectors are arranged may comprises at least one of air, nitrogen, and a high molecular weight gas (for example, xenon, sulphur hexafluoride). Power savings or increased performance can be achieved by using a high molecular weight gas due to the lower thermal conductivity relative to air.

According to a second aspect of the present invention, there is now proposed a method for increasing the sensitivity of an infrared detector, having a plurality of bolometer detectors arranged to operate in contact with a fluid, so as to at least partly compensate for a reduction in the sensitivity of the infrared detector due to conduction of thermal energy from the bolometer detectors through the fluid, the method comprising at least one of the steps of;

(i) connecting the bolometer detectors together in at least one of series and parallel, (ii) operating the bolometer detectors at a DC bias current, and (iii) operating the bolometer detectors at a substantially constant bias temperature.

Preferably, the fluid is at substantially atmospheric pressure and comprises at least one of air, nitrogen, and a high molecular weight gas (for example, xenon).

According to a third aspect of the present invention, there is now proposed a method for operating an infrared detector comprising a plurality of bolometer detectors, means for applying a bias to the bolometer detectors, and means for connecting the bolometer detectors together to form a network, comprising the steps of arranging the bolometer detectors in an environment at substantially atmospheric pressure and operating the bolometer detectors at a substantially constant bias temperature.

Advantageously, the bias temperature is maintained in the range 1° C. to 50° C. above ambient inclusive. Preferably, the bias temperature is maintained in the range 1° C. to 20° C. above ambient inclusive, even more preferably in the range 1° C. to 10° C. above ambient inclusive.

Referring to the method according to the third aspect of the invention and embodiments related thereto, the environment preferably comprises at least one of air, nitrogen, and a high molecular weight gas (for example, xenon).

According to a fourth aspect of the present invention, there is now proposed a passive infrared (PIR) alarm comprising a substrate having integrated thereon a plurality of bolometer detectors adapted to receive electromagnetic radiation from a scene, means for applying a bias to the bolometer detectors, means for connecting the bolometer detectors together to form a network, and signal processing means responsive to an output signal from the network of bolometer detectors;

wherein the signal processing means is configured to identify variations in the output signal due to changes in the electromagnetic radiation incident on the network of bolometer detectors, and to provide an output indicative of an event in the scene.

Specifically, the output may be indicative of at least one of spatial and temporal variations in the infrared radiation incident on the bolometer detectors, for example arising from the introduction or movement of an infrared source within the field of view of the infrared alarm.

Preferably, the bolometer detectors are arranged in an environment at substantially atmospheric pressure.

Conveniently, the environment comprises at least one of air, nitrogen, and a high molecular weight gas.

The bias means is preferably arranged to operate the bolometer detectors at a substantially constant bias temperature.

Conveniently, the bias temperature is arranged, in use, to be in the range 1° C. to 50° C. above ambient inclusive. Preferably the bias temperature is in the range 1° C. to 20° C. above ambient inclusive, even more preferably in the range 1° C. to 10° C. above ambient inclusive.

Preferably, the passive infrared (PIR) alarm comprises a single substrate having the bolometer detectors, the bias means, the connecting means and the signal processing means integrated thereon. An integrated PIR alarm facilitates fabrication and therefore reduces manufacturing costs over discrete components. Accordingly, the passive infrared (PIR) alarm may comprise a monolithic integrated circuit and in particular a silicon monolithic integrated circuit. The monolithic integrated circuit may be one of an n-channel MOSFET (NMOS) integrated circuit, a p-channel MOSFET (PMOS) integrated circuit and a complementary MOSFET (CMOS) integrated circuit.

Using the silicon based approach it is feasible to integrate a complete PIR detection system (e.g. amplification, detection thresholds, timing functions) onto the same chip as the detectors themselves, thus allowing much smaller and cheaper PIR detection modules to be made. The use of the accurate lithography means that a bolometer based PIR detector can have a very precisely defined size, position and shape.

In addition it is possible to integrate the full functionality of the PIR sub-system onto the detector chip, offering lower overall cost.

In a preferred embodiment, the passive infrared (PIR) alarm is adapted to operate as an intruder alarm.

In another preferred embodiment, the passive infrared (PIR) alarm is adapted to operate as a fire alarm.

BRIEF DESCRIPTION OF THE DRAWINGS

The invention will now be described, by example only, with reference to the accompanying drawings in which;

FIG. 3 illustrates how the outputs from the bolometer detectors are compensated against thermal drift. Specifically, FIG. 3a illustrates a bolometer operated at constant current whereas

DETAILED DISCUSSION OF EMBODIMENTS

Conventional bolometer detectors are not considered as a credible alternative to conventional PZT PIR detectors on grounds of disparate technical performance and high cost. One of the main cost drivers is the packaging technology required to provide an evacuated, hermetically sealed enclosure around the bolometer detector(s). In the present infrared detector, the bolometer detectors are operated in an environment (e.g. air) at substantially atmospheric pressure, thereby eliminating the expensive vacuum packaging. Conduction of thermal energy away from a bolometer detector is higher in air than in a vacuum, resulting in reduced sensitivity of the infrared detector. However, in the present invention, the reduction in sensitivity is at least partly compensated by combining a plurality of bolometer detectors together in a network and/or operating the bolometer detectors at a high bias power/current.

Figure 1:
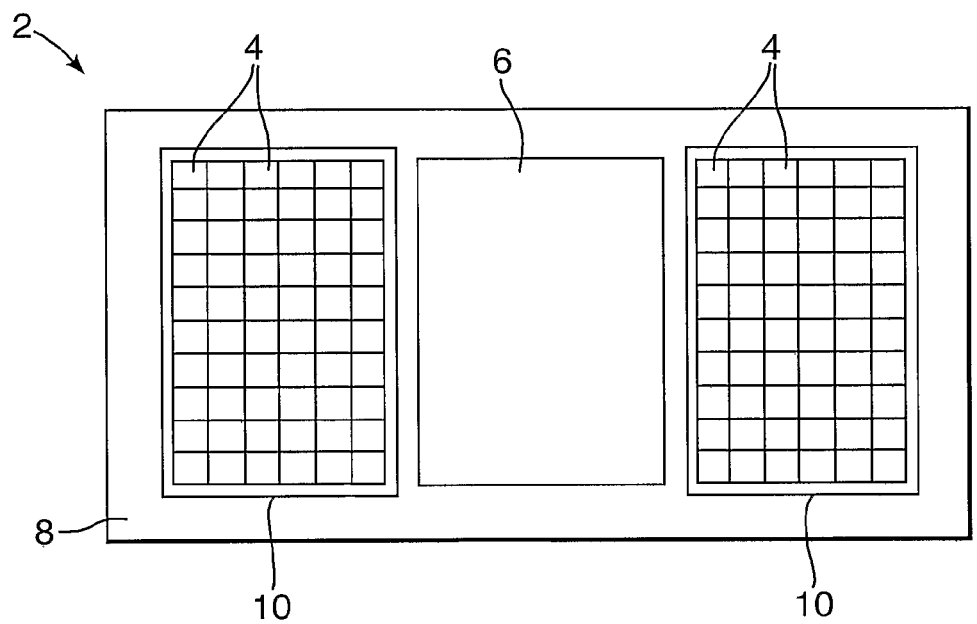
FIG. 1 shows a schematic plan view of an infrared detector according to one embodiment of the present invention.

Referring now to a first embodiment of the invention, FIG. 1 shows an infrared detector (2) comprising a plurality of bolometer detectors (4) and associated electronics (6) arranged on a substrate (8).

The bolometer detectors are configured as a series/parallel connected block.

Operating a plurality of detectors connected together in this manner gives an improvement in sensitivity equal to the square root of the number of detectors. For example a conventional PIR detector measuring 0.25 mm×1.0 mm could be replaced by a group of 14×3 bolometer detectors (assuming a similar density of bolometer detectors as found in current focal plane arrays) and would be 6.5× more sensitive than a single bolometer detector.

The individual bolometer detectors (4) are connected electrically is series, in parallel, or in a series/parallel combination to give a convenient overall electrical resistance to match the available electronics (6). For example, to match an amplifier with high voltage noise a series combination might be used.

Figure 2:
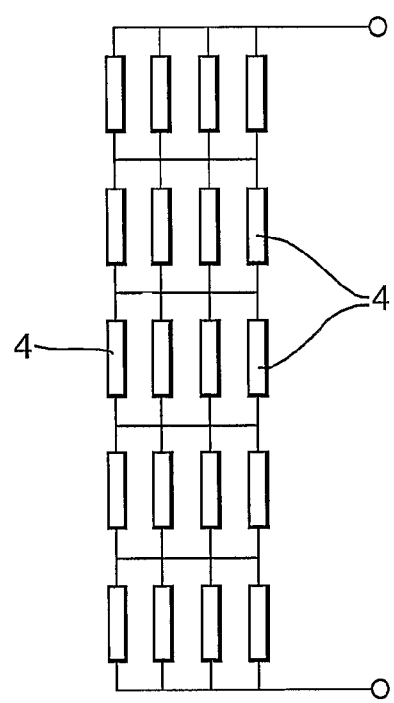
FIG. 2 shows a schematic circuit diagram of the bolometer detectors configured according to one embodiment of the present invention. The figure shows a network of bolometers connected in a series/parallel configuration.

FIG. 2 shows a network of bolometer detectors (4) according to the present invention connected in a series/parallel configuration.

In FIG. 2, the overall resistance would be 5/4 of the value of an individual bolometer detector (4). The additional benefit of using at least some parallel connection is that in the event of an individual bolometer detector (4) failing and going open-circuit, there is only a partial loss in the overall active area of the sensor.

The use of large groups (10) of bolometer detectors (4) greatly simplifies the external electronics, giving a single output per group (10) of bolometer detectors (typically 1 or 2 groups (10) of bolometer detectors (4) per infrared detector).

Figure 3A:
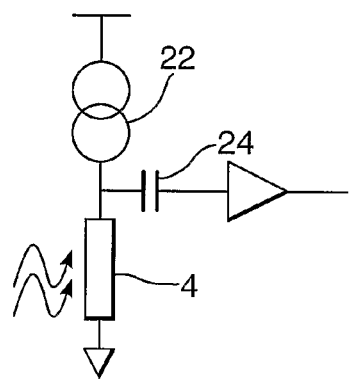
Figure 3B:
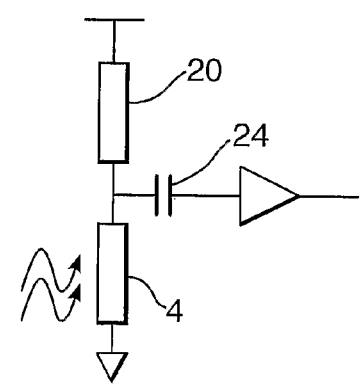
FIG. 3b illustrates the use of a duplicate (dummy) bolometer to compensate for thermal drift.

Referring to FIG. 3b, compensation for signals caused by changes in ambient temperature can be carried out in a similar way to the method currently widely used in PIR detectors, using a duplicate device (dummy) (20) which is either shielded from the incoming radiation or which is not thermally isolated from the substrate (8). Alternatively, referring to FIG. 3a, a constant current source (22) is used in place of the duplicate device (dummy) (20).

The pyroelectric detectors currently used in PIR detectors are inherently AC coupled to the incoming radiation (i.e. they only respond to changes in radiation). The lower time constant for this is generally ill-defined. In the case of an intruder detector, this is the parameter that sets how slowly a detector may be approached without setting off the alarm. In an intruder alarm in the embodiments shown in FIG. 3, an external AC coupling capacitor (24) is used, which enables the time constant to be precisely controlled if necessary.

Figure 4:
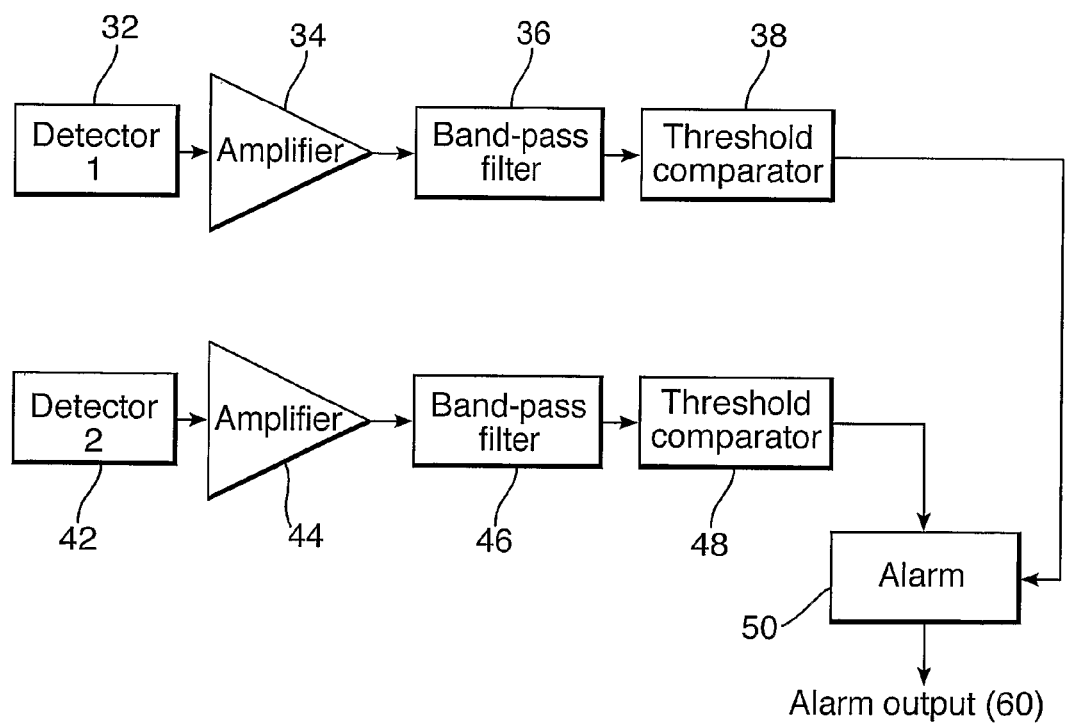
FIG. 4 shows a schematic block diagram of an integrated PIR alarm system according to one embodiment of the invention.

An integrated passive infrared (PIR) alarm system (30) according to one embodiment of the invention is shown in FIG. 4. The PIR alarm (30) comprises two groups (32, 42) of bolometer detectors, each with an associated amplifier (34, 44). The output from each of the two groups (32, 42) of detectors is amplified (34, 44), filtered by band-pass filters (36, 46) and compared to level thresholds by comparators (38, 48). Logical processing is then carried out by the alarm processor (50) to provide an alarm output (60). When adapted to operate as an intruder alarm, the logical processing decides on the presence of an intruder, and the direction in which the an intruder is travelling. In another embodiment, the logical processing requires multiple events in a given period of time prior to raising the alarm output (60).

The process by which the bolometer detectors (4) are fabricated is compatible with conventional CMOS processing technology. Accordingly, in another embodiment of the invention, the infrared detector comprises an embedded microprocessor and complex digital electronics integrated onto the same chip as the bolometer detectors, allowing a user to programme particular functions for particular applications.

Each bolometer detector (4) may be fabricated as described in WO/GB00/03243. In such a device a micro-bolometer is formed as a micro-bridge in which a layer of e.g. titanium is spaced about 1 to 4 μm, typically 2.5 μm, from a substrate surface by thin legs. Typically the titanium is about 0.1 to 0.25 μm thick in a range of 0.05 to 0.3 μm with a sheet resistance of about 3.3 Ω/sq in a range of 1.5 to 6 Ω/sq. The titanium bolometer detector micro-bridge is supported under a layer of silicon oxide having a thickness of about λ/4 where λ is the wavelength of radiation to be detected. Such a titanium detector can be adapted to detect a variety of wavelengths which include those in the infra red radiation band between 3 and 14 μm. Infrared energy incident on the detector is absorbed by the combination of micro-bridge (titanium) and silicon oxide layers, and the subsequent change in temperature causes the resistance of the titanium to change. Hence measuring the detector resistance provides a value of the incident radiation amplitude.

In conventional thermal imagers, packaging in a vacuum is needed to reduce the thermal conduction which would otherwise occur through the air surrounding the bolometer detectors (4). The vacuum enables this thermal conduction to reduced so that it is less than the conduction through the supporting legs of the device.

Air at atmospheric pressure has a conductivity around 100× the typical leg conductance, so the sensitivity in the imaging case would be around 100× worse using air than a vacuum. Operating the bolometer detectors at DC enables some of this performance loss to be recovered, because the higher thermal conductance of the air (or a gas) surrounding the bolometer detectors in the present invention allows a larger bias current to be used for a given temperature rise in the bolometer detectors. The limitation on the bias current through the bolometer in the DC operating case is the temperature rise in the bolometer itself −10° C. or so above ambient would be a typical value.

Having a higher thermal conductance reduces the signal so that (using first-order approximations).

$$Isig \propto \alpha Psig\sqrt{Tbias/RG}$$

where Isig=signal current, a=temperature coefficient, Psig=signal power, Tbias=bias temperature due to DC current, R=electrical resistance G=thermal conductance. The current noise to a first order is proportional to $1/\sqrt{R}$, so the performance is give by:—

$$NETD \propto \alpha\sqrt{Tbias/G}$$

Figure 5:
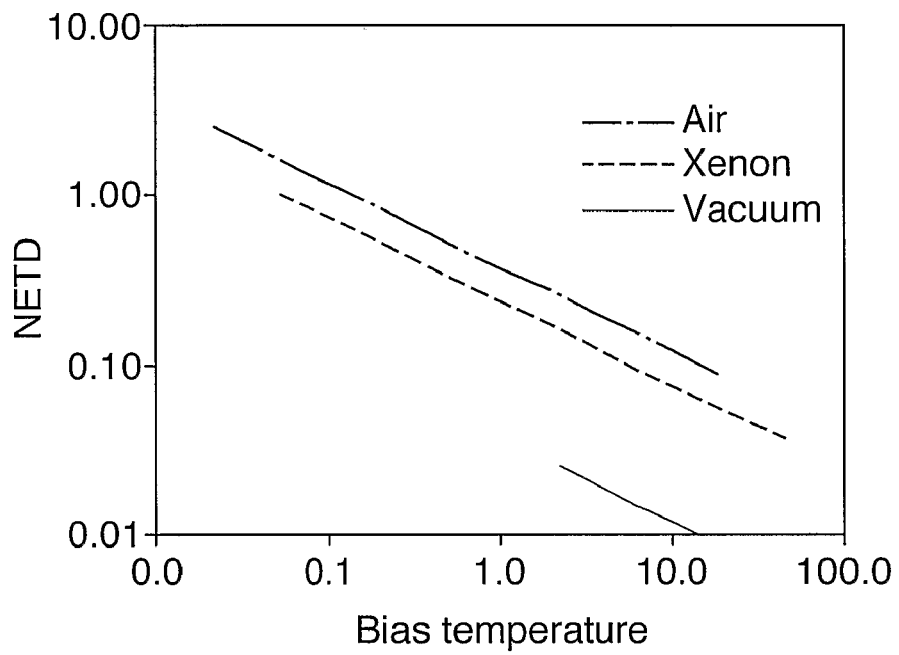
FIG. 5 shows a graph of noise-equivalent temperature difference (sensitivity) (° C.) versus bias temperature (° C.) for a bolometer detector according to the present invention operated in environments comprising xenon and air respectively.
Figure 6:
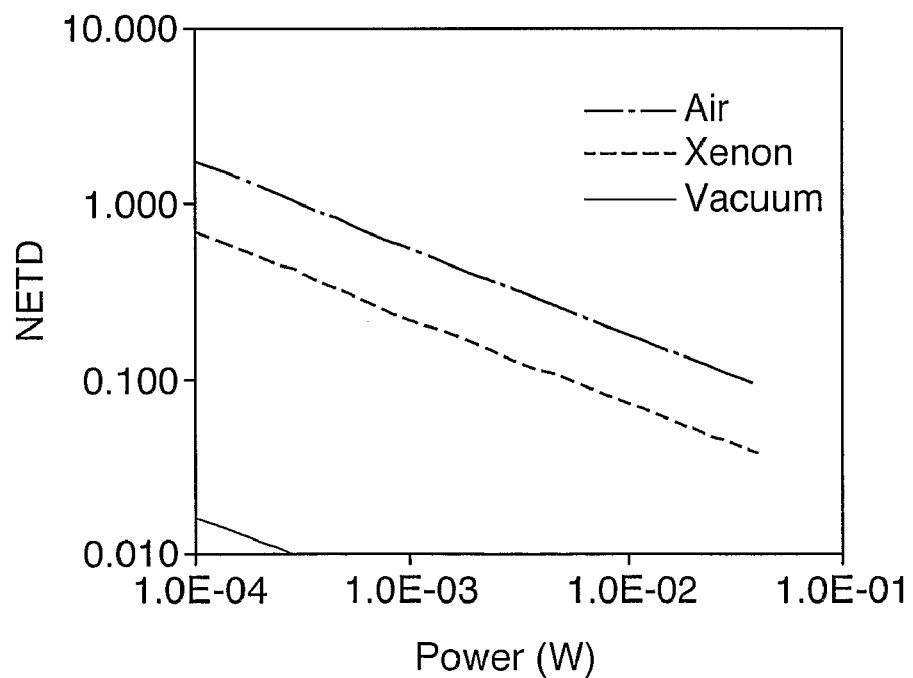
FIG. 6 shows a graph of noise-equivalent temperature difference (sensitivity) (° C.) versus power (Watts) for a bolometer detector according to the present invention operated in environments comprising xenon and air respectively.

Using values based on conventional imaging arrays, the performance of a 1 mm×0.25 mm pixel arranged in an environment comprising air has been predicted as a function of bias temperature and power consumption (FIGS. 5 and 6 refer). The predictions assume a 100 Hz bandwidth, and 50% efficient radiation absorption.

A noise-equivalent temperature difference (NETD) of 0.1° C. is achievable with an air packaged bolometer detector according to the present invention, thus eliminating the expensive step of vacuum packaging.

It is worth noting than a substantial power saving is achievable by packaging the bolometer detectors in an environment comprising a high molecular (or atomic) weight gas such as xenon, which has a lower conductivity than air (by a factor of 2.5). The high atomic weight of xenon means that it is less likely to diffuse through package seals than air, and so does not make the sealing any more onerous than, say, sealing in dry nitrogen to prevent corrosion and condensation, a process routinely carried out in the semiconductor industry.

It should be noted that the 100 Hz bandwidth used in the example is typical of a high-grade military PIR system and could almost certainly be reduced by a factor of 10 (equivalent to 3× better sensitivity) for a domestic PIR system.

The invention claimed is:

1. An infrared detector comprising:
a plurality of bolometer detectors,
bias circuitry for applying a bias to the bolometer detectors, and
connectors configured to connect at least two of the bolometer detectors together to form a network, wherein the bolometer detectors are arranged in an environment at substantially atmospheric pressure and the bias circuitry is arranged to operate the bolometer detectors at a substantially constant bias temperature, wherein the connectors are arranged to reconfigure the bolometer detectors within the network into a plurality of configurations.

2. An infrared detector according to claim 1 wherein, the connectors are arranged to connect the bolometer detectors together in at least one of series and parallel within the network.

3. An infrared detector according to claim 1 wherein the bias circuitry is arranged to provide only a DC bias current to the bolometer detectors within the network.

4. An infrared detector. according. to claim 1 comprising a substrate having the bolometer detectors, the bias circuitry, and the connectors integrated thereon.

5. An infrared detector according to claim 1 wherein the bias temperature is in the range 1° C. to 50° C. above ambient inclusive.

6. An infrared detector according to claim 1 wherein the connectors are arranged to reconfigure the bolometer detectors within the network in real time.

7. An infrared detector according to claim 1 wherein the bolometer detectors comprise at least one resistance bolometer.

8. An infrared detector according to claim 1 wherein the number of bolometer detectors is in the range 10-1000 inclusive.

9. An infrared detector according to claim 1 wherein the bolometer detectors are adapted to detect radiation having a wavelength in the range 3 µm-14 µm.

10. An infrared detector according to claim 1 wherein the environment comprises at least one of air, nitrogen, and a high molecular weight gas.

11. A method for increasing the sensitivity of an infrared detector, having a plurality of bolometer detectors arranged to operate in contact with a fluid at substantially atmospheric pressure, so as to at least partly compensate for a reduction in the sensitivity of the infrared detector due to conduction of thermal energy from the bolometer detectors through the fluid, the method comprising the steps of;
   (i) connecting at least two of the bolometer detectors together in at least one of series and parallel to form a network,
   (ii) operating the bolometer detectors at a DC bias current, and
   (iii) operating the bolometer detectors at a substantially constant bias temperature, wherein the step of connecting reconfigures the at least two bolometer detectors within the network into a plurality of configurations.

12. A method according to claim 11 wherein the fluid comprises at least one of air, nitrogen, and a high molecular weight gas.

13. A method for operating an infrared detector comprising a plurality of bolometer detectors, bias circuitry for applying a bias to the bolometer detectors, and connectors for connecting the bolometer detectors together to form a network, said method comprising the steps of:
   arranging the bolometer detectors in an environment at substantially atmospheric pressure; and
   operating the bolometer detectors at a substantially constant bias temperature, wherein the connectors are arranged to reconfigure the bolometer detectors within the network into a plurality of configurations.

14. A method according to claim 13 wherein the bias temperature is maintained in the range 1° C. to 50° C. above ambient inclusive.

15. A method according to claim 13 wherein the environment comprises at least one of air, nitrogen, and a high molecular weight gas.

16. A passive infrared (PIR) alarm comprising:
   a substrate having integrated thereon a plurality of bolometer detectors adapted to receive electromagnetic radiation from a scene, wherein the bolometer detectors are arranged in an environment at substantially atmospheric pressure,
   bias circuitry for applying a bias to the bolometer detectors arranged to operate the bolometer detectors at a substantially constant bias temperature,
   connectors for connecting at least two of the bolometer detectors together to form a network, wherein the connectors are arranged to reconfigure the bolometer detectors within the network into a plurality of configurations, and
   a signal processor responsive to an output signal from the network of bolometer detectors, wherein the signal processor is configured to identify variations in the output signal due to changes in the electromagnetic radiation incident on the network of bolometer detectors, and to provide an output indicative of an event in the scene.

17. A passive infrared (PIR) alarm according to claim 16 wherein the environment comprises at least one of air, nitrogen, and a high molecular weight gas.

18. A passive infrared (PIR) alarm according to claim 16 wherein the bias temperature is in the range 1° C. to 50° C. above ambient inclusive.

19. A passive infrared (PIR) alarm according to claim 16 adapted to operate as an intruder alarm.

20. A passive infrared (PIR) alarm according to claim 16 adapted to operate as a fire alarm.

21. An infrared detector according to claim 1 wherein the number of bolometer detectors is in the range 40-200 inclusive.

* * * * *